United States Patent [19]

Yoshitake et al.

[11] Patent Number: 5,324,953
[45] Date of Patent: Jun. 28, 1994

[54] REDUCED-PROJECTION EXPOSURE SYSTEM WITH CHROMATIC ABERRATION CORRECTION SYSTEM INCLUDING DIFFRACTIVE LENS SUCH AS HOLOGRAPHIC LENS

[75] Inventors: Yasuhiro Yoshitake, Yokohama; Yoshitada Oshida, Fujisawa; Masataka Shiba; Yasuhiko Nakayama, both of Yokohama, all of Japan

[73] Assignee: Hitachi, Ltd., Tokyo, Japan

[21] Appl. No.: 12,775

[22] Filed: Feb. 3, 1993

[30] Foreign Application Priority Data

Feb. 5, 1992 [JP] Japan .................................. 4-019800

[51] Int. Cl.$^5$ .............................................. G06K 7/015
[52] U.S. Cl. ...................................... 250/557; 356/400
[58] Field of Search ................ 250/548, 557, 561; 356/400, 401, 399; 359/13, 569, 130

[56] References Cited

U.S. PATENT DOCUMENTS

| | | |
|---|---|---|
| 4,862,008 | 8/1989 | Oshida et al. .................. 250/548 |
| 5,004,348 | 4/1991 | Magome ........................... 356/401 |
| 5,094,539 | 3/1992 | Komoriya et al. .............. 356/401 |
| 5,137,363 | 8/1992 | Kosugi et al. ................... 356/401 |

OTHER PUBLICATIONS

Hiroshi Kubota; Optics; 1986; pp. 46-47.
Thomas Stone et al.; Hybrid diffractive-refractive lenses and achromats; Applied Optics; vol. 27; No. 14; Jul. 15, 1988; pp. 2960-2971.
Dean Faklis et al.; Broadband imaging with holographic lenses; Optical Engineering; vol. 28; No. 6; Jun. 1989; pp. 592-598.

Primary Examiner—David C. Nelms
Assistant Examiner—Que T. Le
Attorney, Agent, or Firm—Antonelli, Terry, Stout & Kraus

[57] ABSTRACT

A novel exposure system includes a reduced-projection lens optimized for a predetermined single exposure wavelength and a chromatic aberration correction system for TTL (Through The Lens) alignment with broadband light. The correction system includes a holographic lens which dispersion has a negative number in contrast to a conventional glass lens which has a positive dispersion number. By employing a holographic lens, the total optical length of an alignment system can be made short enough to avoid the necessity of installing a mirror therein, thus realizing a highly accurate alignment system.

3 Claims, 2 Drawing Sheets

REDUCED-PROJECTION EXPOSURE SYSTEM WITH CHROMATIC ABERRATION CORRECTION SYSTEM INCLUDING DIFFRACTIVE LENS SUCH AS HOLOGRAPHIC LENS

BACKGROUND OF THE INVENTION

The present invention relates to an alignment detection optical system, or more in particular to an exposure system of reduced projection type comprising an alignment detection optical system of TTL (Through The Lens) type for detecting marks on a wafer through a projection optical system.

In conventional methods of fabricating a semiconductor device, a stepper is used for projection exposure of a circuit pattern on a mask while moving the wafer stepwise. A semiconductor device is fabricated by sequential alignment and superimposed exposure of a circuit pattern on a mask and a circuit pattern on a wafer coated with a resist providing a photosensitive material. This alignment is effected by detecting alignment marks on the wafer. A high-precision alignment requires a TTL system for detecting the marks through an exposure projection detection system as an effective means. The resist is coated while rotating the wafer, and therefore, as shown in FIG. 4, an asymmetric thickness distribution of a resist film 312 is caused by resist flow in the direction of detection in the vicinity of an uneven base mark 311. When the resist is irradiated with a light of narrow wavelength range the detected light intensity changes periodically with the resist film thickness as shown in FIG. 5A. As a result, the image detection of an alignment mark having an asymmetric resist distribution with a light of narrow wavelength range causes an increased emphasis of asymmetry of the resist film thickness distribution resulting in a detection error of the detected wavelength as shown in FIG. 5B. The irradiation of a light of broad wavelength range, on the other hand, reduces the change in the intensity of the detected light with the resist film thickness as shown in FIG. 6A, with the result that the detected waveform becomes symmetric thereby making possible a high-accuracy alignment as shown in FIG. 6B.

The compatibility between the TTL system and the detection with a light of broad wavelength range requires the resolution of the problem mentioned below.

In a projection optical system, the aberration is corrected generally only for the exposure light of single wavelength for transferring a fine pattern. The detection by the TTL system with a light of broad wavelength range, therefore, displaces the image points of various wavelengths. The resulting chromatic aberration blurs the detection waveform and makes a high-accuracy alignment impossible. In order to obviate this problem, as disclosed in JP-A-1-227431, a method has been suggested in which an optical system for correcting the chromatic aberration for a light of broad wavelength range is configured of glass lenses and inserted between a projection lens and a detector.

In the prior art described above, an optical system for chromatic aberration correction is configured of glass lenses, and therefore an increased number of glass lenses are used for the chromatic aberration correction system, thereby undesirably reducing the resolution of the alignment detection optical system as a whole, due to the adjustment error or the surface error of the optical elements.

SUMMARY OF THE INVENTION

The object of the present invention is to solve the above-mentioned problem of the prior art by providing an exposure system of reduced projection type in which the optical system for chromatic aberration correction of an alignment detection optical system of TTL type is reduced in size and the resolution of the alignment pattern on the substrate such as a wafer is improved for realizing a high-accuracy alignment.

According to the present invention, there is provided an exposure system of projection type comprising a projection lens optimized for a single wavelength for pattern exposure, and an alignment detection optical system including an irradiation optical system for irradiating the alignment mark on the projection substrate through the projection lens with a light of broad wavelength range and a detection optical system for correcting the chromatic aberration caused in the projection lens at the time of detection of an alignment mark. More specifically, the chromatic aberration correction optical system is configured of a holographic lens which is obtained by interference between a convergent light and a parallel light and recording the resulting interference fringe on a photosensitized plate. The holographic lens bends the light path by diffraction but not by refraction. Therefore, the angle of bend thereof increases with wavelength. Thus, the longer the wavelength, the shorter the focal length. In this way, the holographic lens has a wavelength dependency opposite to that of the glass lens.

A method of correcting the chromatic aberration will be explained. By way of simplification, reference will be had to a chromatic aberration correction optical system for rendering image points coincident with each other at wavelengths of λA and λB for two thin lenses As described in "Optics" pp. 46-47, by Hiroshi Kubota, published in 1986 by Iwanami Shoten, the condition for rendering image points of light of different wavelengths coincident with each other is expressed by equation (1) below.

$$\frac{h_1^2}{f_1 \nu_1} + \frac{h_2^2}{f_2 \nu_2} = 0 \tag{1}$$

where the subscripts 1 and 2 designate the lenses 1 and 2 respectively, h the distance from the optical axis at a point where the light ray enters the lens, f the focal length, and $\nu$ the dispersion number of glass (Abbe number), which may alternatively be expressed as shown by equation (2).

$$\nu = \frac{n_M - 1}{n_A - n_B} \tag{2}$$

where $n_A$, $n_B$ designate the refractive indexes of glass for wavelengths of λA, λB respectively, and $n_M$ the mean of $n_A$ and $n_B$. The combined focal length $f_S$ of the two lenses can be expressed by equation (3) using the distance D between them.

$$\frac{1}{f_s} = \frac{1}{f_1} + \frac{1}{f_2} - \frac{D}{f_1 f_2} \tag{3}$$

where if D is sufficiently small as compared with $f_1$, $f_2$, equations (1) and (3) are simplified as shown by equations (4) and (5) below respectively.

$$\frac{1}{f_1 v_1} + \frac{1}{f_2 v_2} = 0 \qquad (4)$$

$$\frac{1}{f_s} = \frac{1}{f_1} + \frac{1}{f_2} \qquad (5)$$

The refractive index of all glass materials monotonously decreases with the increase in wavelength. Therefore, the value $v$ defined by equation (2) never becomes negative, so that a combination of convex and concave lenses is required if equation (4) is to be satisfied. In order to form a real image, for example, the combined focal length $f_S$ is required to be positive. In this case, equation (5) indicates the necessity of a combination of a convex lens with short focal length and a concave lens with long focal length.

As explained above, in the case where an optical system for chromatic aberration correction is configured of glass lenses, a convex lens combined with a concave lens lengthens the combined focal length $f_S$ as compared with that of the convex lens.

In such a case, the distance L between an object and an image is expressed by equation (6) below using the magnification m.

$$L = \frac{f_s(1 + m)^2}{m} \qquad (6)$$

When m is assumed to be constant, the distance L increases with the increase in focal length f. This indicates a larger optical system for chromatic aberration correction, thereby making it necessary to bend the light path by mirror for the purpose of packaging. When a mirror is inserted, however, the resolution of the optical system as a whole would decrease depending on the angular or area accuracy of the mirror.

The present invention is based on the fact that as described in "Applied Optics", Vol. 27, No. 14, pp. 2960-2971 at p. 2962, the condition for chromatic abberation correction of equation (4) is satisfied by a combination of a convex glass lens and a holographic lens having a positive focal length in view of the fact that the dispersion number $v$ of a holographic lens is negative. According to the present invention, therefore, the combined focal length determined by equation (5) is shorter than the focal length of each lens, with the result that the distance between an object and image determined by equation (6) is capable of being reduced as compared with an exclusive glass lens configuration. It is thus possible to realize a compact alignment optical system. As a consequence, the resolution of an alignment pattern on the substrate like a wafer is improved, thereby realizing a highly accurate alignment.

DESCRIPTION OF THE PREFERRED EMBODIMENTS

Figure 1:
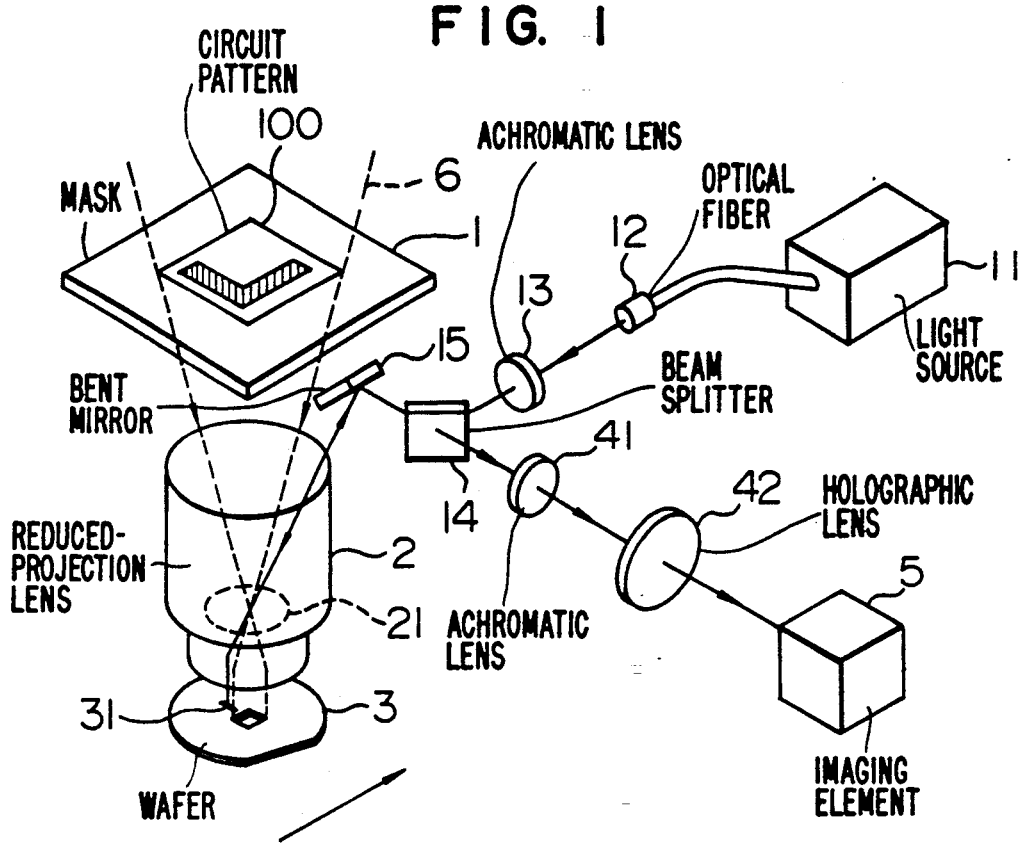
FIG. 1 is a diagram showing a configuration of an alignment detection system of TTL type for a reduced-projection exposure system according to an embodiment of the present invention.

Embodiments of the present invention will be explained specifically with reference to the drawings. First, an embodiment of the present invention is shown in FIG. 1. A circuit pattern 100 on a mask 1 is transferred onto a wafer 3 through a reduced-projection lens 2. The reduced-projection lens 2 is so designed that the circuit pattern may be resolved in the most appropriate manner when the exposure light 6 is used. The light emitted from a light source 11 having a broad wavelength range is guided by an optical fiber 12. An achromatic lens 13, a beam splitter 14 and a bent mirror 15 are arranged to receive the light in such a manner that the center of the light coincides with that of the entrance pupil of the reduced-projection lens 2, and the light irradiates an alignment mark 31 on the wafer 3 through the reduced-projection lens 2. The light reflected from the alignment mark 31 enters an imaging element 5 through the reduced-projection lens 2, the bent mirror 15, the beam splitter 14, an achromatic lens 41 and a holographic lens 42. An image of the alignment mark 31 is formed on the imaging element 5 by the reduced-projection lens 2, the achromatic lens 41 and the holographic lens 42.

Figure 2:
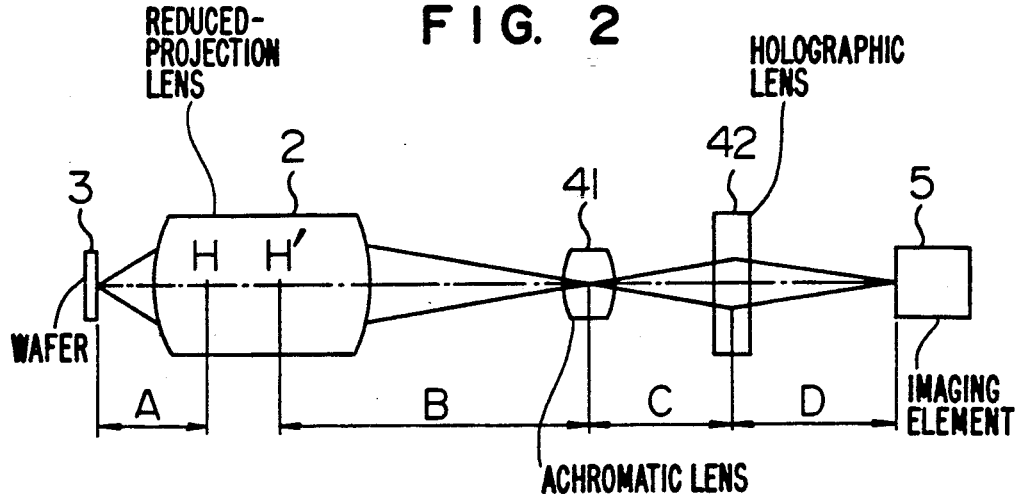
FIG. 2 is a diagram showing the arrangement of an optical system for chromatic aberration correction according to the present invention.

Now, an explanation will be made with reference to FIG. 2 about the relative positions and the focal length of the reduced-projection lens 2, the achromatic lens 41 and the holographic lens 42 required for forming an image on the imaging element with the chromatic aberration corrected. Assume that the distance between the wafer 3 and the front principal point H of the reduced-projection lens 2 is given as A, the distance between the rear principal point H' of the reduced-projection lens 2 and the achromatic lens 41 as B, the distance between the achromatic lens 41 and the holographic lens 42 as C, and the distance between the holographic lens 42 and the imaging element 5 as D.

The achromatic lens 41 is arranged at an image-forming point of reduced-projection lens 2. An image of the rear principal point H' is formed on the holographic lens 42. As a result, the relation between the focal length $F_2$ of the achromatic lens 41 and B, C is expressed by equation (7) below.

$$\frac{1}{F_2} = \frac{1}{B} + \frac{1}{C} \qquad (7)$$

Figure 3:
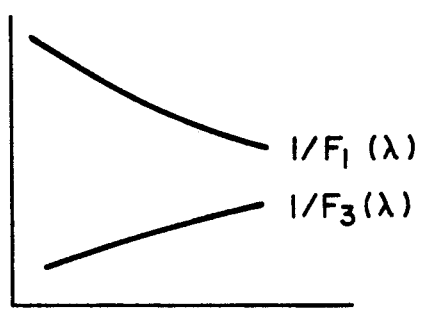
FIG. 3 is a diagram showing the relation between the reciprocals $1/F_1(\lambda)$, $1/F_3(\lambda)$ of the focal length and the wavelength $\lambda$ according to the present invention.
Figure 4:
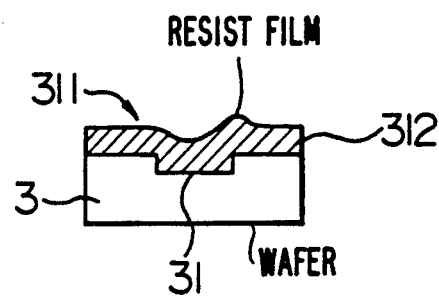
FIG. 4 is a diagram showing a sectional view of the base mark and an asymmetric resist film thickness distribution.
Figure 5A:
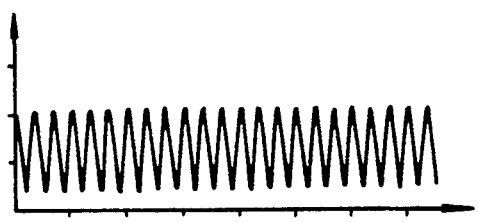
FIG. 5A is a diagram showing the relation between the detection intensity and the resist film thickness with a light of narrow wavelength range irradiated, and FIG. 5B a diagram showing a detection waveform thereof.
Figure 5B:
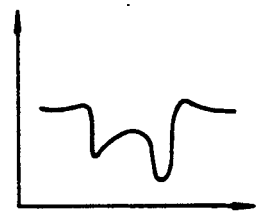
Figure 6A:
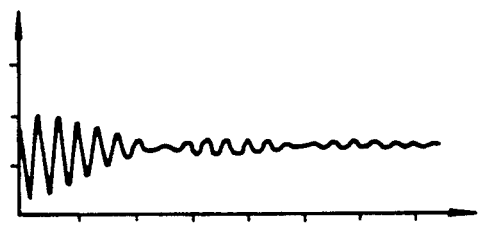
FIG. 6A is a diagram showing the relation between the detection intensity and the resist film thickness with a light of broad wavelength range irradiated, and FIG. 6B a diagram showing a detection waveform thereof.
Figure 6B:
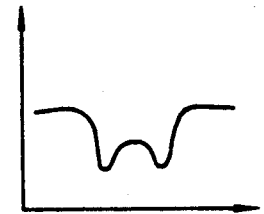

The achromatic lens 41, which functions as a field lens operating to collect light flux, does not affect the chromatic aberration correction. If the chromatic aberration is to be corrected in this optical system, it is necessary to meet the requirement of equation (8) below, as described in "Optical Engineering", Vol. 28, No. 6, pp. 592-598 at p. 595.

$$\frac{1}{F_3(\lambda)} = \frac{1}{C} + \frac{1}{D} + \frac{B^2}{C^2}\left(\frac{1}{A} + \frac{1}{B} - \frac{1}{F_1(\lambda)}\right) \quad (8)$$

where $1/F_1(\lambda)$ is the reciprocal (power) of the focal length of the reduced-projection lens 2, and $1/F_3(\lambda)$ is the focal length of the holographic lens 42, each being dependent on the wavelength $\lambda$. The relation between $1/F_1(\lambda)$, $1/F_3(\lambda)$ satisfying equation (8) and the wavelength $\lambda$ is shown in FIG. 3. The wavelength dependency of the reciprocal (power) of the focal length of the holographic lens, which is opposite to that of the glass lens, satisfies equation (8). As a result, a configuration as shown in FIG. 2 can correct the chromatic aberration of the reduced-projection lens 2 while at the same time reducing the length between the object and the image, i.e./between the wafer 3 and the imaging element 5, without using a concave lens.

The holographic lens 42 may be fabricated by a method as described, for example, in "Optical Engineering", Vol. 28, No. 6, pp. 592-598 at p. 596.

According to an alignment detection optical system of TTL type for a reduced-projection exposure system according to the present embodiment, the chromatic aberration of a reduced-projection lens is corrected by use of a holographic lens instead of a concave lens. As a consequence, the distance between the wafer and the imaging surface is reduced, thereby simplifying the package. At the same time, the bending of a light path by a mirror is eliminated, and the resolution of a detection system is improved, thus realizing a highly accurate alignment.

We claim:

1. A reduced-projection exposure system for projecting a circuit pattern on a mask onto a substrate, the substrate having an alignment mark formed thereon, the apparatus comprising:

means for illuminating the circuit pattern on the mask with an exposure light having a single wavelength;

a reduced-projection lens for projecting a reduced image of the circuit pattern illuminated by the exposure light onto the substrate, the reduced-projection lens having optical properties optimized for the single wavelength of the exposure light;

a mirror disposed outside of a path of the exposure light between the mask and the reduced-projection lens;

a beam splitter;

means for illuminating the alignment mark on the substrate through an entrance pupil of the reduced-projection lens with an alignment light having a broad wavelength range such that the alignment light is incident on the mirror via the beam splitter, reflected from the mirror to the alignment mark on the substrate through the entrance pupil of the reduced-projection lens, reflected from the alignment mark back to the mirror through the entrance pupil, and reflected from the mirror back t the beam splitter as reflected alignment light;

a field lens disposed at a focal point of the reduced-projection lens where the reduced-projection lens forms an image of the alignment mark for receiving the reflected alignment light from the beam splitter and condensing the reflected alignment light without affecting chromatic aberration of the reflected alignment light, the chromatic aberration being caused by the reduced-projection lens when the alignment light passes through the reduced-projection lens;

a diffractive lens disposed at a conjugate point of a principal point on an image side of the reduced-projection lens for forming an image of the alignment mark from the alignment light condensed by the field lens while correcting the chromatic aberration of the alignment light, the diffractive lens having a focal length which decreases with increasing wavelength;

an imaging element disposed at a conjugate point of the alignment mark for converting the image of the alignment mark formed by the diffractive lens into a detection signal; and means for aligning the substrate relative to an optical axis of the reduced-projection lens by displacing the substrate substantially perpendicularly to the optical axis in accordance with the detection signal.

2. A reduced-projection exposure system according to claim 1, wherein the diffractive lens is a holographic lens.

3. A reduced-projection exposure system according to claim 1, wherein a focal length $F_3$ of the diffractive lens is defined by a formula $$1/F3 = 1/C + 1/D + (B^2/C^2).1A + 1/B - 1/F1)$$

where

A is a distance between the alignment mark and a principal point on an object side of the reduced-projection lens, B is a distance between the principal point on the image side of the reduced-projection lens and the field lens, C is a distance between the field lens and the diffractive lens, D is a distance between the diffractive lens and a light receiving plane of the imaging element, and F1 is a focal length of the reduced-projection lens.

* * * * *